US011296501B2

(12) United States Patent
Segervall et al.

(10) Patent No.: US 11,296,501 B2
(45) Date of Patent: *Apr. 5, 2022

(54) INTEGRATED ESD EVENT SENSE DETECTOR

(71) Applicant: Texas Instruments Incorporated, Dallas, TX (US)

(72) Inventors: Alan Erik Segervall, Half Moon Bay, CA (US); Ross Anthony Pimentel, Monte Sereno, CA (US); Sumantra Seth, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/910,656

(22) Filed: Jun. 24, 2020

(65) Prior Publication Data

US 2020/0321779 A1 Oct. 8, 2020

Related U.S. Application Data

(63) Continuation of application No. 15/808,490, filed on Nov. 9, 2017, now Pat. No. 10,749,337.

(60) Provisional application No. 62/456,977, filed on Feb. 9, 2017.

(51) Int. Cl.
*H02H 9/04* (2006.01)
*H01L 27/02* (2006.01)
*H02H 1/00* (2006.01)
*H01L 23/00* (2006.01)

(52) U.S. Cl.
CPC ......... *H02H 9/046* (2013.01); *H01L 27/0248* (2013.01); *H01L 27/0259* (2013.01); *H01L 27/0281* (2013.01); *H02H 1/0007* (2013.01); *H02H 9/044* (2013.01); *H01L 24/05* (2013.01); *H01L 24/06* (2013.01); *H01L 2224/06135* (2013.01); *H02H 1/0061* (2013.01)

(58) Field of Classification Search
CPC ...... H02H 9/046; H02H 4/044; H02H 1/0007; H02H 1/0061; H02H 9/00; H02H 9/04; H02H 3/20; H02H 9/02; H02H 9/005; H01L 27/0259; H01L 24/06; H01L 2224/06135; H01L 27/0281
USPC .......................................................... 361/56
See application file for complete search history.

(56) References Cited

U.S. PATENT DOCUMENTS

| | | | |
|---|---|---|---|
| 10,749,337 B2 * | 8/2020 | Segervall | H02H 1/0007 |
| 2008/0029820 A1 | 2/2008 | Disney et al. | |
| 2012/0154963 A1 | 6/2012 | Deval et al. | |
| 2013/0016447 A1 | 1/2013 | Kitabata | |
| 2015/0280415 A1 | 10/2015 | Welty | |

(Continued)

*Primary Examiner* — Danny Nguyen
(74) *Attorney, Agent, or Firm* — John Pessetto; Charles A. Brill; Frank D Cimino

(57) ABSTRACT

As an example, a circuit is provided. The circuit includes an ESD (electrostatic discharge) clamping circuit with a control signal controlling clamping operations of the ESD clamping circuit. The circuit further includes a counter coupled to the control signal of the ESD clamping circuit. The counter produces a set of output signals responsive to the control signal. The circuit also includes a communications interface for coupling to the set of output signals of the counter. The (Continued)

communications interface also couples to communications circuitry external to the circuit.

6 Claims, 6 Drawing Sheets

(56) References Cited

U.S. PATENT DOCUMENTS

2016/0172849 A1   6/2016   Dibra et al.

\* cited by examiner

INTEGRATED ESD EVENT SENSE DETECTOR

CROSS-REFERENCE TO RELATED APPLICATION

This continuation application claims priority to U.S. patent application Ser. No. 15/808,490, filed Nov. 9, 2017, which claims priority to and the benefit of U.S. Provisional Patent Application No. 62/456,977 filed Feb. 9, 2017, both of which are incorporated herein by reference in their entirety.

BACKGROUND

Electrostatic discharge (ESD) may interfere with the operation of semiconductor devices. ESD protection represents a part of semiconductor design for many devices. ESD protection may be implemented with wide channel clamping transistors, which often stand out as large devices on the edge of a sea of smaller devices with minimal geometry. Recognizing that ESD events are happening, and acting to avoid these problems is a continuing challenge for semiconductor designers.

SUMMARY

As an example, a circuit is provided. The circuit includes an ESD (electrostatic discharge) clamping circuit with a control signal controlling clamping operations of the ESD clamping circuit. The circuit further includes a counter coupled to the control signal of the ESD clamping circuit. The counter produces a set of output signals responsive to the control signal. The circuit also includes a communications interface for coupling to the set of output signals of the counter. The communications interface also couples to communications circuitry external to the circuit.

The foregoing, and other features and advantages of the invention, will be apparent from the following, more particular description of the embodiments of the invention, the accompanying drawings, and the claims.

BRIEF DESCRIPTION OF THE DRAWINGS

For a more complete understanding of the various embodiments, and any advantages thereof, reference is now made to the ensuing descriptions taken in connection with the accompanying drawings briefly described as follows.

DETAILED DESCRIPTION

Figure 1:
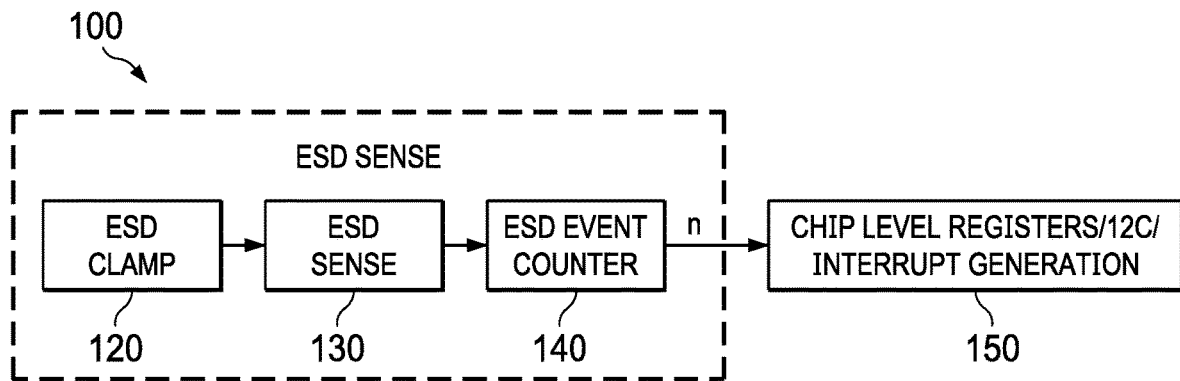
FIG. 1 illustrates an embodiment of an ESD event handling and counting system.

Embodiments of the present invention and their advantages may be understood by referring to FIGS. 1-8, wherein like reference numerals refer to like elements.

Clamping signals for ESD events tend to be strong signals capable of driving large metal-oxide semiconductor (MOS) devices (including MOS field-effect transistors (MOSFETs)) and causing relatively fast gate transitions necessary to reduce or eliminate damage from ESD events. Using such signals to trigger a monitoring circuit thus allows for relatively simple design and takes advantage of features of a circuit already present to accomplish another goal. Moreover, monitoring ESD events, or at least the frequency of such events can assist in determining when external ESD issues are causing problems within a system, and may allow for proactive intervention before a failure occurs.

In an embodiment, a circuit is described which can sense ESD events when the device is powered up and keep a count of the number of ESD events. The resulting counter value can be used to generate an interrupt or may be used by higher software layers to decide on a next course of action.

In some embodiments, the techniques may be used to detect if or when an ESD event is affecting system functionality, performance, or reliability. This has broad application since ESD and its negative side effects may occur in many systems. In some embodiments, a circuit or circuits are provided that can sense an ESD event and capture that in an event log that can be used to generate a system interrupt, board diagnostics, and failure analysis information. Additionally, in some embodiments, a sense circuit may be used to sense the primary ESD clamp gate voltage or current.

In various embodiments, the sense electrical parameter may be used to trigger a comparator to generate a pulse and the pulse can be used to count (increment a counter). In various embodiments, an asynchronous ripple counter may be used as the counter and can be operated from the pulse generated by the sense circuit.

The ESD sense design techniques of various embodiments may provide solutions for both Active Clamp and Ground Referenced Snapback protection and are capable of detecting both positive and negative going ESD strikes. When an ESD event is detected, an asynchronous counter may be used to log the ESD event. The counter may be designed to freeze the count at its maximum count of 0b 111111 (decimal 63) or 64, for example, depending on counter design. The counter may be any arbitrary depth as appropriate to specific applications. In some embodiments, the ESD Event Counter may be loaded into a device I2C (inter-integrated circuit) or SMI (serial management interface) accessible register stack where it can be off loaded into non-volatile memory (NVM) for later diagnostics.

Information from the ESD Event Counter may be accessed through a CAN (Controller Area Network) bus, for example, and may use an OBD (on board diagnostics) protocol, for example. Various ISO standards exist for such buses and protocols.

ESD circuits typically may have some sort of triggering mechanism that can be leveraged to detect when an ESD event happens, such as a signal, which causes a gate to clamp, for example. In an embodiment, an active clamp gate node may trigger high any time there is an ESD event as part of clamping in response to the ESD event. In another embodiment, a distributed active clamp network allows monitoring of ESD strikes to any IO in the ESD domain. Moreover, note that a counter may be linked to any number of ESD signals, allowing a counter count based on ESD events in a single circuit (or pad, for example), or based on multiple pads or all pads on a device, for example.

FIG. 1 illustrates an embodiment of an ESD event handling and counting system. System 100 includes an ESD sensing and counting component and external circuitry used to signal other components of an overall system incorporating system 100. ESD sense components 110 provide ESD handling and counting functionality. ESD clamp components 120 sense electrostatic discharge and clamp a circuit to provide a path for discharge of excess charge. ESD sense components 130 sense activity of ESD clamp components 120 and communicate this to ESD event counter 140. ESD event counter 140 counts ESD events handled by ESD clamp components 120 and sensed by ESD sense components 130. Counter 140 provides a signal to communications hardware 150, which may include a chip-level register, an Inter-Integrated Circuit (I2C) communications channel, or an interrupt generation circuit or system, for example.

Figure 2:
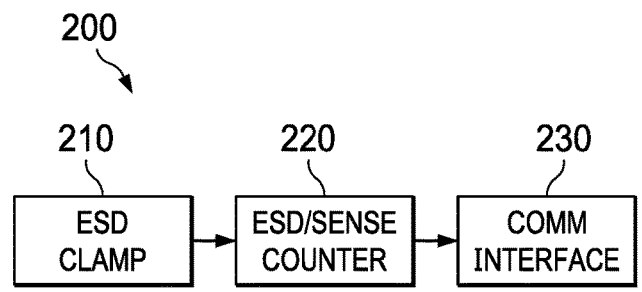
FIG. 2 illustrates another embodiment of an ESD event handling and counting system.

Further considering how an ESD monitoring system may operate, FIG. 2 illustrates another embodiment of an ESD event handling and counting system. System 200 includes clamping, sensing and counting and communications portions. ESD clamp module 210 clamps to discharge excess charge when an ESD event occurs. ESD sense/counter module 220 senses operation of ESD clamp module 210 through internal signals of ESD clamp module 210, and counts ESD events handled by ESD clamp module 210. ESD sense/counter module 220 then communicates through communications interface 230 with other circuits, modules and systems to provide information about ESD events, particularly how many such events have occurred.

Figure 3:
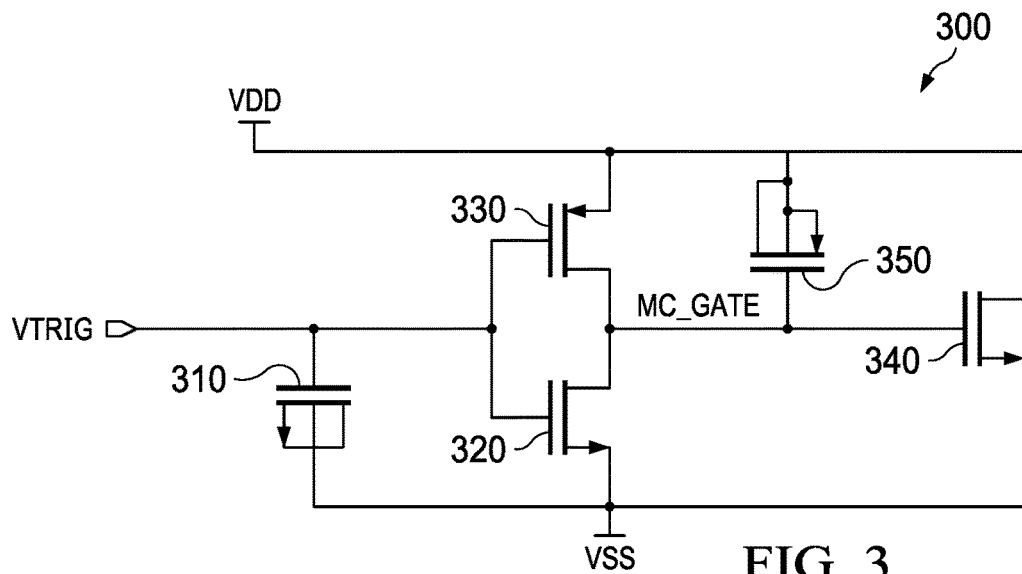
FIG. 3 illustrates an embodiment of an ESD clamping circuit.

Many examples of ESD clamping or ESD protection circuits exist. Reviewing an embodiment of such a circuit can illustrate how to integrate with such a circuit to monitor ESD events. FIG. 3 illustrates an embodiment of an ESD clamping circuit. Circuit 300 senses an ESD event and clamps its output node thereby draining charge from the ESD event prior to damage to a circuit. Signal Vtrig triggers circuit 300, inverting the gate signal MC_GATE and thereby causing MOS device 340, serving as a clamping transistor, to drain charge from its drain node. As illustrated, device 340 is a large device, capable of draining much more current than minimum width or minimum geometry devices. Signal Vtrig couples to devices 320 and 330, which form a complementary MOS (CMOS) inverter between a supply (drain) voltage (Vdd) and source voltage (Vss). MC_GATE thus provides an output signal from the inverter formed by devices 320 and 330, and thereby drives the gate of device 340. MC_GATE is also connected to the gate of MOS device 350, which is an MOS device capacitively coupling vdd to MC_GATE. Vtrig is similarly capacitively coupled to Vss through MOS device 310. MOS device 310 may be formed from a MOS transistor with a drain and source tied together, for example.

Figure 5:
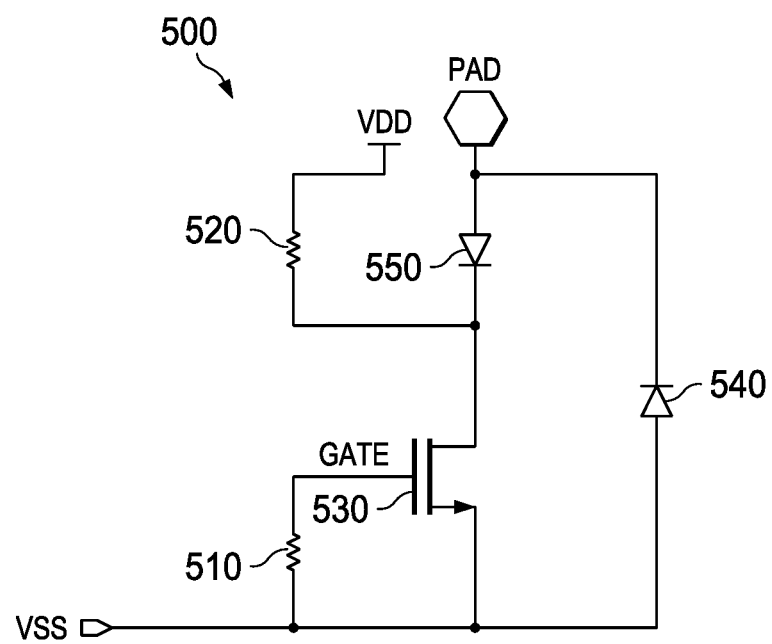
FIG. 5 illustrates another embodiment of an ESD clamping circuit.

One may use a cascoded design for larger devices, based on a design such as that shown in FIG. 3 or that shown in FIG. 5, for example. Clamping circuits such as those of FIG. 3 or FIG. 5 may be used around an integrated circuit to provide protection to pins (and related pads) or groups or rings of pins, for example. In some embodiments, each bond pad or each pin may have a dedicated clamping circuit or silicon controlled rectifier (SCR) or snapback circuit, for example. Moreover, a counter such as that of FIG. 7, for example, may be provided for an entire integrated circuit, or multiple counters may be provided for an integrated circuit, with counters dedicated to portions of the integrated circuit, for example. Also, dedicated counters may be provided for each pin if necessary.

Additionally, in some embodiments, it may be difficult to integrate non-volatile memory as part of an integrated circuit, such as in the case of manufacturing processes without non-volatile memory capabilities, in which case results may be communicated off of the integrated circuit to another integrated circuit where non-volatile memory is available to store results. Providing the results outside of an integrated circuit may allow for analysis of issues such as excessive failures or multiple failures in a particular area of a system, for example.

Figure 4:
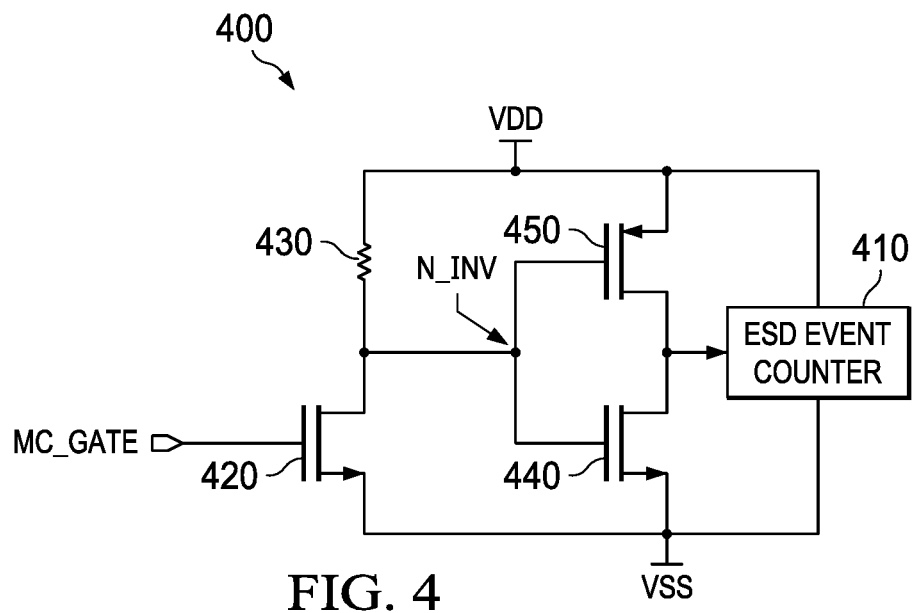
FIG. 4 illustrates an embodiment of an ESD event counting circuit suitable for use with the clamping circuit of FIG. 3.

With an ESD clamping circuit available, one may then monitor ESD events by monitoring operation of the ESD clamping circuit. FIG. 4 illustrates an embodiment of an ESD event counting circuit suitable for use with the clamping circuit of FIG. 3. Circuit 400 operates cooperatively with circuit 300 of FIG. 3 to count ESD events that trigger circuit 300. MC_GATE drives a gate of MOS device 420, which operates as a resistive inverter with pullup resistor 430. When MC_GATE causes device 420 to pull down, Gate_N_inv then drives a CMOS inverter made up of devices 440 and 450 operating between vdd and vss. The resulting output signal then couples to ESD event counter 410, which in one embodiment is a 6-bit asynchronous ripple counter.

Other clamping circuits can be used in various embodiments. An embodiment utilizing SCR or snapback ESD detection may utilize the voltage developed from Miller coupling on to the GATE of an n-channel MOS (NMOS) snapback or drain extended NMOS (DENMOS) SCR device during an ESD event. Such an embodiment may use a gate node of DENMOS SCR for positive ESD events and a drain extended p-channel MOS (DEPMOS) to Miller couple negative going events. FIG. 5 illustrates another embodiment of an ESD clamping circuit using a snapback approach. Circuit 500 provides for input at a pad (PAD) and protection from ESD events at the PAD. PAD is coupled through a diode 550 to resistive pullup 520 (and thence to vdd) and through MOS device 530 (and thence to Vss). Reverse-biased diode 540 provides a return current path from VSS to PAD. Resistive pulldown 510 normally pulls down the GATE input at device 530. During an ESD event, the Miller capacitance of device 530 couples charge on to resistor 510 which helps initiate device 530 into snapback. Diode 550 forward biases and injects carriers into the substrate triggering on SCR device 530 which serves as a clamping transistor.

In an embodiment, resistor 520 is a 1 Mohm resistor which biases the drain node of device 530. In some embodiments, device 530 may be a drain extended NMOS transistor with a gate resistor which can assist to monitor Vdd (a drain supply or power supply, for example). The circuitry may need to monitor a gate of device 530 for voltage slewing higher on a hit (of charge) to the pad, as the ESD event may cause the gate to slew high, but not much higher than the gate threshold for device 530, and it may be useful to amplify the signal at the gate of device 510 in order to detect the ESD event. Device 610 of FIG. 6 may provide a drain extended PMOS device (or transistor) similar to device 510, but associated with a ground or Vss source supply that may be detected as going excessively negative.

Figure 6:
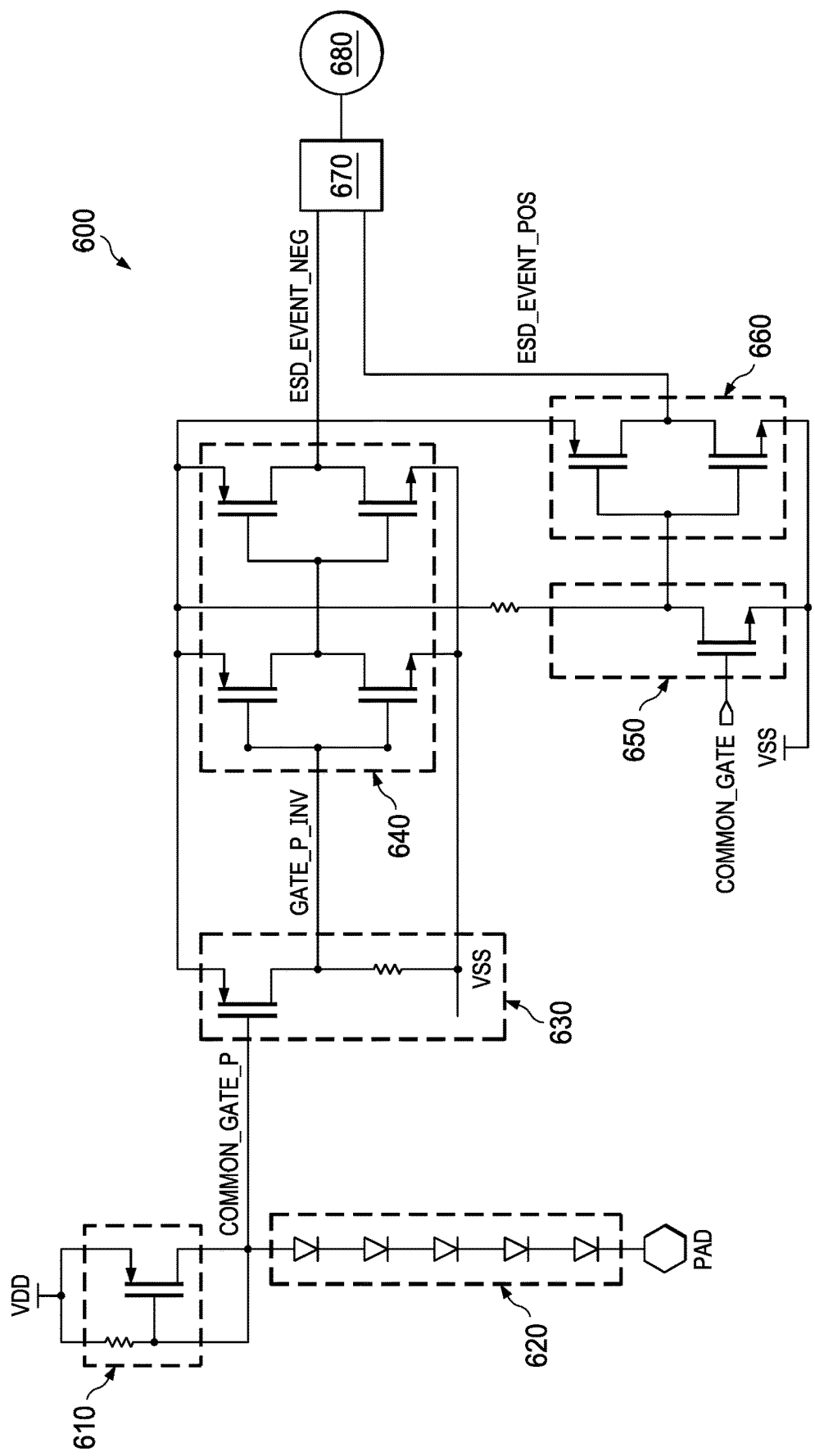
FIG. 6 illustrates an embodiment of an ESD event counting circuit suitable for use with the clamping circuit of FIG. 5.

With another ESD protection circuit, one may use a similar counting circuit with a different interface. FIG. 6 illustrates an embodiment of an ESD event counting circuit suitable for use with the clamping circuit of FIG. 5. Circuit 600 operates in conjunction with circuit 500 of FIG. 5 to count ESD events. Resistive pullup and MOS device collectively shown as 610 operate to Miller couple a negative edge event to signal Common_Gate_P, with diode stack 620 operating to effectively level shift into a signal range. Common_Gate_P then drives resistive inverter 630 to produce Gate_P_inv. Gate_P_inv then flows through two CMOS inverters 640 to produce the ESD_EVENT_NEG signal, which drives event counter 670. Event counter 670 produces output 680, which in this embodiment is a six-bit counter output.

Separately, Common_Gate signal is Miller coupled on positive edge ESD events, through resistive inverter 650 and CMOS inverter 660 to produce ESD_EVENT_POS. Common_Gate signal may come from GATE input at device 530 of FIG. 5, for example, or from another circuit used to manage a pad input, for example. ESD_EVENT_POS also drives counter 670, allowing for counting of both types of events. In an embodiment, ESD_EVENT_NEG and ESD_EVENT_POS are inputs to a NOR gate which then triggers counter 670, allowing for counting of both events in counter 670.

Figure 7:
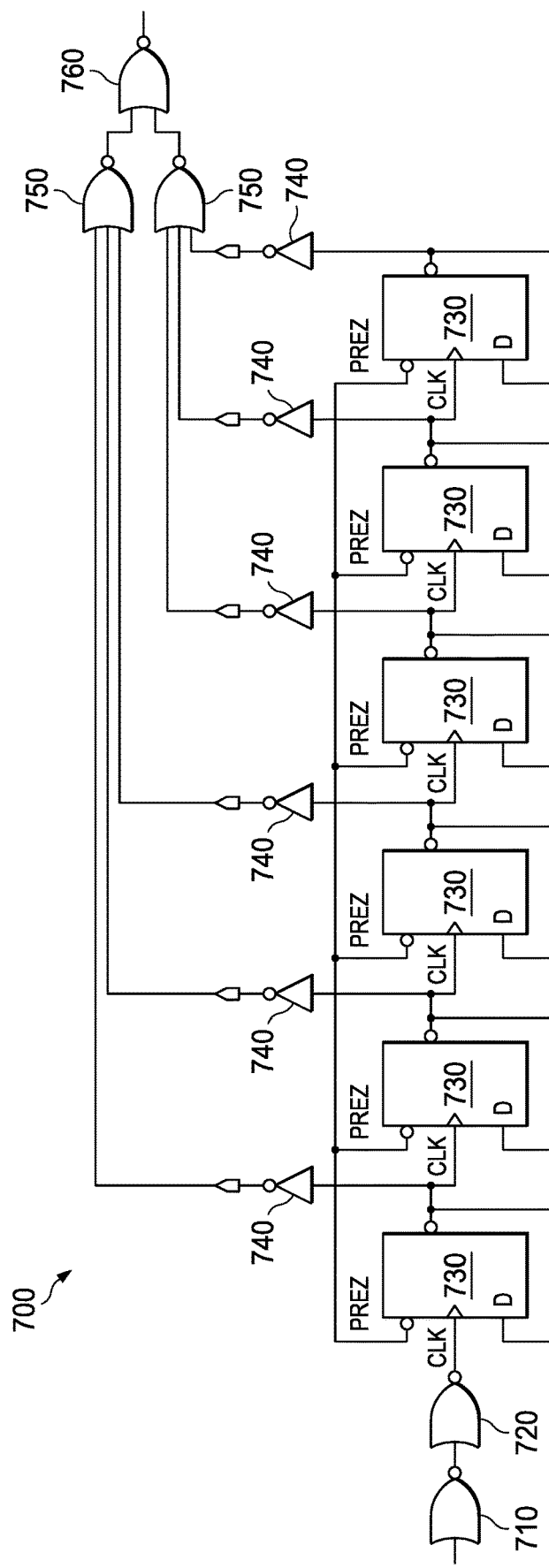
FIG. 7 illustrates an embodiment of a counter, which may be used with the counting circuits of FIG. 4 or FIG. 6, for example.

Various counters may be used to count ESD events, although the unpredictable nature of ESD events means that asynchronous counters may be preferable to avoid inadvertently missing events. FIG. 7 illustrates an embodiment of a counter, which may be used with the counting circuits of FIG. 4 or FIG. 6, for example. The counter presented in FIG. 7 (a ripple counter) is just one type of counter contemplated for use herein as other types of counters may also be used.

Counter 700 provides an example of an asynchronous ripple counter, using D-type flip-flops (D-FF) 730. Preset line PREZ is connected to an inverting input of each flip-flop 730 for initializing the flip-flops in conjunction with initializing the count of Counter 700. Input gate 710 logically NORs trigger input signals, producing an output as input to gate 720. An inverting output of each D flip-flop 730 is connected to its respective D input. Gate 720 logically NORs its input to trigger the first D-FF 730. Each of the successive D-FFs is coupled in series (cascaded) pursuant to a counter design. Each D-FF has an output signal which passes through an output inverter 740 to provide a counter output bit. The output bits are then fed into NAND gates 750 and thence to NOR gate 760 to produce a freeze signal when all of the bits are 1. NAND gates 750 and NOR gate 760 provide an example of a combining circuit. Other examples may include other logical AND circuits or multiplexing circuits, for example. This prevents the counter from rolling over once it reaches its maximum value.

Figure 8:
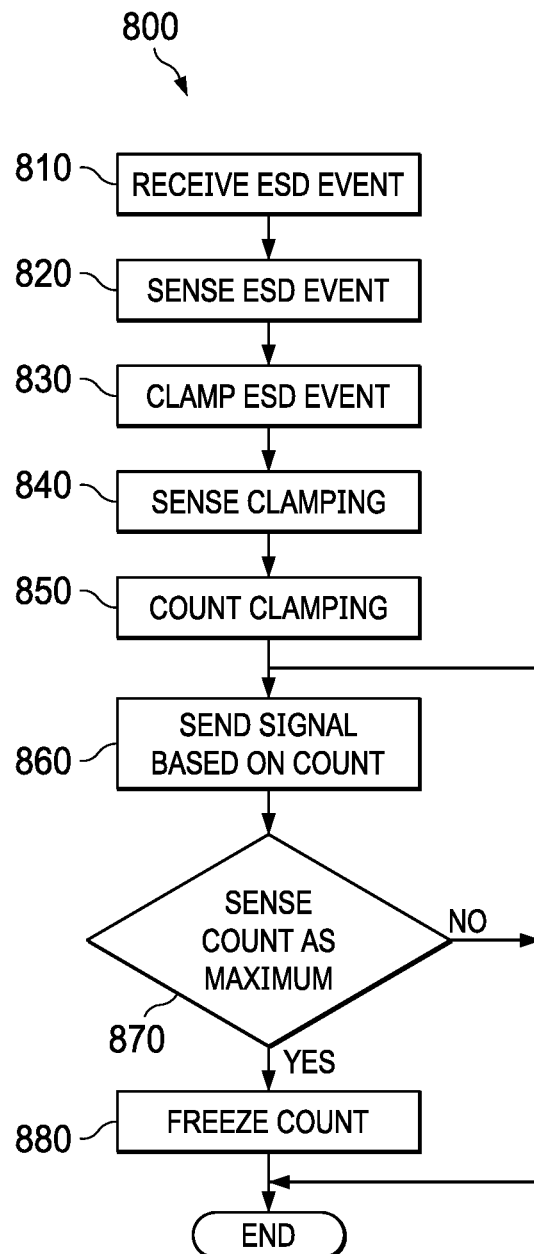
FIG. 8 illustrates an embodiment of a process of managing and counting ESD events, and signaling in relation thereto.

Many different processes may be implemented to handle and monitor ESD events. FIG. 8 illustrates an embodiment of a process of managing and counting ESD events, and signaling in relation thereto. Process 800 includes receiving and reacting to an ESD event, counting the event, and signaling based on the count. At step 810, an ESD event is received, such as a voltage surge or drop, for example. At step 820, the ESD event is sensed by protective circuitry such as that of FIG. 3 or FIG. 5, and at step 830, clamping occurs, limiting damage and draining away excess charge. At step 840, the clamping operation is sensed, and at step 850, the clamping event is counted by a counter. This part of the process (steps 810-850) may be repeated until the counter hits a predetermined threshold resulting in sending a signal at step 860 (such as through a comparator, not shown). Additionally, at step 870, a determination is made as to whether a maximum count has been reached. If so, the count is frozen. Once the count is frozen it will not continue to count unless the counter is cleared. However, the counter can be set to count any arbitrary depth.

Figure 9:
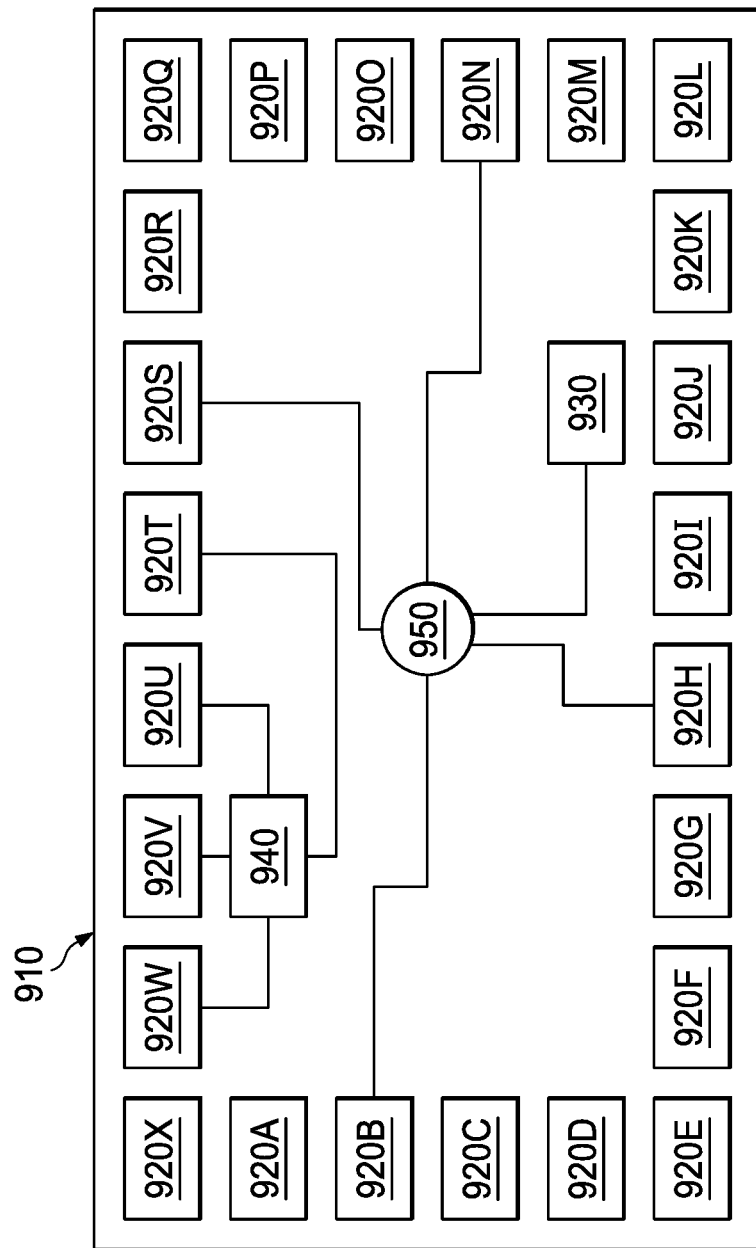
FIG. 9 illustrates an embodiment of an apparatus in which an ESD clamping circuit may be implemented and used.

FIG. 9 illustrates an embodiment of an apparatus in which an ESD clamping circuit may be implemented and used.

FIG. 9 provides an illustration of an embodiment of an apparatus such as an integrated circuit in which an ESD clamping circuit may be incorporated, for example. Device 910 is illustrated with details sufficient to show use of an ESD clamping circuit while leaving aside other details to avoid unnecessarily obscuring the invention. Device 910 is illustrated with a group of bond pads 920 (920A, 920B, . . . 920X) which can be used for receiving and sending electrical signals. Some bond pads 920 may be used as ground bond pads, power supply bond pads, or other supply bond pads, as opposed to bond pads dedicated to input/output signals.

In an embodiment, a group of bond pads 920S, 920T, 920U, 920V, and 920W are used with a single ESD clamping circuit 940, which is coupled to each bond pad. In order to electrically isolate the bond pads, the ESD clamping circuit may be coupled through a diode, for example, to each bond pad (920S, 920T, 920U, 920V, and 920W). In some embodiments, coupling may be through a combination of a forward biased diode and a reverse biased diode in parallel as well. Thus, clamping circuit 940 may handle ESD events for a group or ring of bond pads (920S, 920T, 920U, 920V, and 920W) without requiring individual ESD clamping circuits for each bond pad.

Alternatively, a group of bond pads may have a shared ESD circuit based on similar function, such as power or ground bond pads, for example. Thus, bond pads 920B, 920H, 920N and 920R are coupled together and electrically connected without isolation to a connection point 950, along with ESD clamping circuit 930. Circuit 930 provides ESD protection for each of the bond pads as part of a group of bond pads. Other configurations and formats may also be useful in this context and in various other embodiments, depending on features such as electrical isolation or connection and likelihood of ESD strikes, for example.

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

We claim:

1. A circuit, comprising:
   an electrostatic discharge (ESD) clamping circuit having a control signal controlling clamping operations of the ESD clamping circuit;
   an asynchronous ripple counter coupled to the control signal of the ESD clamping circuit, the counter producing a set of output signals responsive to the control signal; and
   a communications interface for coupling to the set of output signals of the counter and to communications circuitry external to the circuit.

2. The circuit of claim 1, further comprising:
   a bond pad coupled to the ESD clamping circuit.

3. The circuit of claim 1, further comprising:
a series of bond pads coupled to the ESD clamping circuit.

4. The circuit of claim 1, wherein:
the communications interface is formed to communicate via a Controller Area Network (CAN) bus wired connection with a non-volatile memory.

5. The circuit of claim 1, wherein:
the communications interface is formed to communicate via a wireless communication link.

6. The circuit of claim 1, wherein:
the ESD clamping circuit is a snapback circuit.

* * * * *